(12) United States Patent
Cruz-Albrecht et al.

(10) Patent No.: US 7,403,144 B1
(45) Date of Patent: Jul. 22, 2008

(54) PULSE DOMAIN ENCODER AND FILTER CIRCUITS

(75) Inventors: Jose M. Cruz-Albrecht, Oak Park, CA (US); Peter Petre, Agoura, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/645,936

(22) Filed: Dec. 26, 2006

(51) Int. Cl.
*H03M 3/00* (2006.01)
(52) U.S. Cl. .................. 341/143; 341/144; 341/155
(58) Field of Classification Search .................. 341/143
See application file for complete search history.

(56) References Cited

U.S. PATENT DOCUMENTS

| | | | | |
|---|---|---|---|---|
| 5,396,244 A | * | 3/1995 | Engel | 341/143 |
| 5,815,102 A | * | 9/1998 | Melanson | 341/143 |
| 6,087,968 A | * | 7/2000 | Roza | 341/143 |
| 6,111,531 A | * | 8/2000 | Farag | 341/143 |
| 6,940,438 B2 | * | 9/2005 | Koe et al. | 341/143 |
| 7,180,432 B2 | * | 2/2007 | Oliaei | 341/143 |
| 2005/0190865 A1 | * | 9/2005 | Lazar et al. | 375/340 |

OTHER PUBLICATIONS

S. Ouzounov, et al., "Design of High-Performance Asynchronous Sigma Delta Modulators with a Binary Quantizer with Hysteresis," *IEEE 2004 Custom Integrated Circuits Conference*, 2004, pp. 181-184, IEEE.

* cited by examiner

*Primary Examiner*—Khai M. Nguyen
(74) *Attorney, Agent, or Firm*—Christie, Parker & Hale, LLP

(57) ABSTRACT

A pulse circuit to solve a system of differential equations in the pulse domain based on analog or inputs or time-encoded pulse inputs. Intrinsically linear 1-bit digital to analog converters are used as feedback elements within circuits implementing solutions to a differential equation or to a system of differential equations. The circuits may be used to implement filters. While the input to the circuit may be an analog signal, the internal signals of the circuit are time-encoded current or voltage pulses. Output of the circuit is a time-encoded pulse or a series of time-encoded pulses from which an analog output may be recovered by time decoding.

20 Claims, 18 Drawing Sheets

First Integrator Output

Second Integrator Output

Output Pulse

FIG. 8B $\left(\begin{array}{c}\frac{dx_1(t)}{dt}\\\frac{dx_2(t)}{dt}\end{array}\right)=\begin{pmatrix}c_{11}&c_{12}\\c_{21}&c_{22}\end{pmatrix}\begin{pmatrix}x_1(t)\\x_2(t)\end{pmatrix}+\begin{pmatrix}u_1(t)\\u_2(t)\end{pmatrix}$

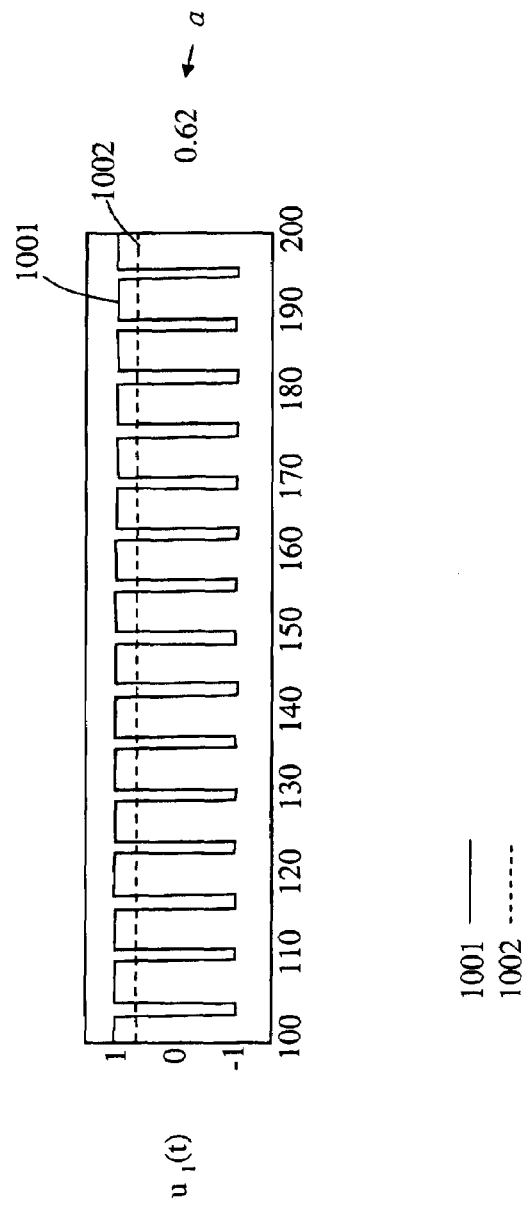

US 7,403,144 B1

PULSE DOMAIN ENCODER AND FILTER CIRCUITS

BACKGROUND OF THE INVENTION a) Field of the Invention

The present invention relates generally to the field of analog encoding and filtering and more particularly to solving systems of differential equations by encoder and filter circuits using time encoding and pulse domain signals.

a) Description of Related Art

Conventionally, differential equations could be solved in the (1) original analog domain via analog amplifiers or in the (2) digital domain after an Analog to Digital Converter (ADC) digitization. In the analog domain, a disadvantage of the conventional approach is that accuracy is severely limited by dynamic range of the analog components such as the feedback analog amplifiers. Conventional circuits for solving differential equations in the analog domain are based on analog computation where the information is encoded in the amplitude of voltages or current signals. Accuracy is limited by the analog components, such as operational amplifiers. In the digital domain, the disadvantage of the conventional approach is that speed is limited by the performance of ADC conversion.

Time encoding, that encodes amplitude information into a time sequence, is an alternative to classical sampling and is used for the design of analog to digital converters. A time encoding machine may be implemented as a real-time asynchronous circuit. Time encoding is invertible such that the amplitude information can be recovered from the time sequence with arbitrary accuracy. The amplitude information in a bandlimited signal can be perfectly recovered if the difference between any two consecutive values of the time sequence is bounded by the inverse of the Nyquist rate.

A Hadamard circuit may be used for performing Hadamard arithmetic operations of analog inputs with the solution encoded in the time domain. However the Hadamard circuit may not be used to solve differential equations. Furthermore, the arithmetic operations of the Hadamard circuit can only be performed on analog inputs.

In short, the conventional circuits solve differential equations in the analog domain via the use of analog components. These circuits are limited by the accuracy of these analog components. They are therefore impractical for applications requiring accuracy. Further, they are limited to pulse encoding and do not attempt to do any processing such as solving differential equations using the encoder machine presented. No prior circuit has been proposed to solve a system of linear first order differential equations in the pulse domain.

SUMMARY OF THE INVENTION

Embodiments of the present invention include circuits that can be used to solve systems of linear first order differential equations that may be used to implement an arbitrary analog linear filter in the pulse domain.

One embodiment of the invention provides a second order unit element encoder circuit for solving a first order linear ordinary differential equation that includes an input amplifier, a first 1-bit digital to analog converter, a first adder, a first integrator, a second 1-bit digital to analog converter, a second adder, a second integrator, and a hysteresis quantizer. The input amplifier is responsive to an input signal and provides an amplified output signal. The first 1-bit digital to analog converter has a first 1-bit digital to analog converter input and a first 1-bit digital to analog converter output. The first adder has a first adder first input responsive to the amplified output signal and a first adder second input responsive to an output signal from the first 1-bit digital to analog converter to provide a first sum output signal. The first integrator is responsive to the first sum output signal and provides a first integrated output signal. The second 1-bit digital to analog converter has a second 1-bit digital to analog converter input and a second 1-bit digital to analog converter output. The second adder has a second adder first input responsive to the first integrated signal and a second adder second input responsive to an output signal from the second 1-bit digital to analog converter signal to provide a second sum signal. The second integrator is responsive to the second sum signal and provides a second integrated output signal. The hysteresis quantizer is responsive to the second integrated output signal and provides a time encoded pulse output signal corresponding to a time encoding of a solution of the first order linear ordinary differential equation. The first 1-bit digital to analog converter is responsive to the time encoded pulse output signal and feeds back the time encoded pulse output signal to the first adder second input. The second 1-bit digital to analog converter is responsive to the time encoded pulse output signal and feeds back the time encoded pulse output signal to the second adder input. The second order unit element encoder circuit may be coupled in series to a time decoder circuit. Further, the time decoder circuit may be responsive to the time encoded pulse output signal and adapted to recover the solution of the first order linear ordinary differential equation from the time encoded pulse output signal.

The input signal may be an analog signal or a pulse signal. Gain of the input amplifier may be a coefficient of the input signal in the first order linear ordinary differential equation, and gain of the second 1-bit digital to analog converter may be a coefficient of the solution of the first order linear ordinary differential equation.

One embodiment of the invention provides an array of encoder circuits including first and second encoder circuits. The first encoder circuit is responsive to a first input signal and provides a first output signal. The second encoder circuit is responsive to a second input signal and provides a second output signal. The array of encoder circuits also includes a first cross-feedback 1-bit DAC for providing the second output signal to the first encoder circuit, and a second cross-feedback 1-bit DAC for providing the first output signal to the second encoder circuit. Each encoder circuit in the array of encoder circuits includes an input amplifier, first and second adders, first and second integrators, and a hysteresis quantizer. The input amplifier is responsive to an amplifier input signal. The first adder is coupled to the input amplifier and to a cross-feedback 1-bit digital to analog converter of the other encoder circuit. The first integrator is coupled to the first adder. The second adder is coupled to the first integrator. The second integrator is coupled to the second adder. The hysteresis quantizer is coupled to the second integrator and provides a hysteresis quantizer output signal. The array of encoder circuits also includes first and second 1-bit DACs. The first 1-bit DAC is coupled between an output of the hysteresis quantizer and the second adder and provides the hysteresis quantizer output signal as a feedback signal to the second adder. The second 1-bit DAC is coupled between the output of the hysteresis quantizer and the first adder and provides the hysteresis quantizer output signal as a feedback signal to the first adder. The first output signal and the second output signal are time encoded pulse signals.

The first output signal may be a time encoding of a solution of a first differential equation included in a coupled system of two first order linear ordinary differential equations, and the second output signal may be a time encoding of a solution of a second differential equation in the coupled system of two first order linear ordinary differential equations.

The array of encoder circuits may further include a time decoder circuit coupled in series to the each of the first and second encoder circuits. The time decoder circuit may be responsive to the first and second output signals and adapted for recovering a solution to the coupled system of two first order linear ordinary differential equations.

The coupled system of two first order linear ordinary differential equations may be represented by a 2×2 multiplier matrix multiplied by a 2×1 solution matrix and added to a 2×1 input signal matrix. The second 1-bit digital to analog converter of each encoder circuit may have a gain equal to a diagonal element of the multiplier matrix. The first and second cross-feedback 1-bit digital to analog converters each may have a gain equal to a non-diagonal element of the multiplier matrix. Further, the first input signal and the second input signal and intermediate signals within the first encoder circuit and the second encoder circuit may be analog signals.

The array of encoder circuits may further include a third cross-feedback 1-bit digital to analog converter for providing the second output signal to a second adder of the first encoder circuit and a fourth cross-feedback 1-bit digital to analog converter for providing the first output signal to a second adder of the first encoder circuit. The first and second input signals may be time-encoded pulse signals. The first output signal may be half of a sum of the first input signal and the second input signal The second output signal may be half of a difference between the first input signal and the second input signal.

The first cross-feedback 1-bit digital to analog converter may have a gain of −1, the second cross-feedback 1-bit digital to analog converter may have a gain of +1, the third cross-feedback 1-bit digital to analog converter may have a gain of −1, the fourth cross-feedback 1-bit digital to analog converter may have a gain of +1, and the first 1-bit digital to analog converter of each encoder circuit and the second 1-bit digital to analog converter of each encoder circuit have a gain of −1.

One embodiment of the invention provides a filter circuit for implementing an analog filter of order N, that includes a first order unit for producing an output signal and a plurality of N second order units for providing N state variables to the first order unit. The output signal is a time encoded pulse. The outputs of the plurality of N second order units are time encoded pulses. Each of the N second order units receives cross-feedbacks of the N state variables from each of the N second order units. A first one of the N second order units receives an external input signal as input. The external input signal is selected from a group consisting of an analog signal and a time encoded pulse signal. The first order unit may be a multiple-input unit element of the first order and the second order unit may be a multiple-input unit element of the second order.

The output signal may be a time encoded voltage pulse and the state variables may be time encoded current pulses. The first and second order units each may include only 1-bit digital to analog converters for providing internal time encoded pulse feedback.

The first order unit may include a bank of N 1-bit digital to analog converters, an adder, an integrator, a hysteresis quantizer, and a feedback amplifier. Each 1-bit digital to analog converter may be responsive to one state variable from one of the second order units. The adder may be coupled to the bank responsive to an output of each of the N 1-bit digital to analog converters in the bank. The adder may be adapted to add together the outputs of the N 1-bit digital to analog converters.

The integrator may be coupled to the adder and the hysteresis quantizer may be coupled to the integrator. The hysteresis quantizer produces the output signal. The feedback amplifier may be coupled between an output of the hysteresis quantizer and the adder for providing the output signal to the adder.

Further, each of the second order units may include a bank of N 1-bit digital to analog converters each of the N 1-bit digital to analog converters responsive to a cross-feedback of one state variable from each of the N second order units, a first adder coupled to the bank responsive to outputs of each of the N 1-bit digital to analog converters in the bank, the first adder adapted to adding together the outputs of the N 1-bit digital to analog converters, a first integrator coupled to the first adder, a second adder coupled to the first integrator, a hysteresis quantizer coupled to the second integrator, the hysteresis quantizer producing an output state variable corresponding to the second order unit, and a feedback amplifier coupled between an output of the hysteresis quantizer and the second adder for providing the output state variable to the second adder.

The first one of the second order units may further include an input amplifier coupled to the first adder and responsive to the input signal. The input amplifier may be a 1-bit digital to analog converter. The filter circuit may implement a filter transfer function selected from a group consisting of Butterworth transfer function, Chebychev transfer function, family of Elliptic transfer functions in a configuration selected from a group consisting of low pass, high pass, band pass, and band stop configurations. The circuit may implement any arbitrary transfer function. The first order unit and the second order units may be implemented in Indium Phosphate fast current IC technology.

BRIEF DESCRIPTION OF THE DRAWINGS

FIG. 8A is a block diagram of a circuit used to solve a system of differential equations according the embodiments of the invention and FIG. 8B shows the system of differential equations being solved by the circuit of FIG. 8A.

FIG. 10A, FIG. 10B, FIG. 10C, and FIG. 10D are plots of input pulses to the circuit of FIG. 9A and output pulses from the circuit of FIG. 9A.

DETAILED DESCRIPTION OF THE INVENTION

Figure 1:
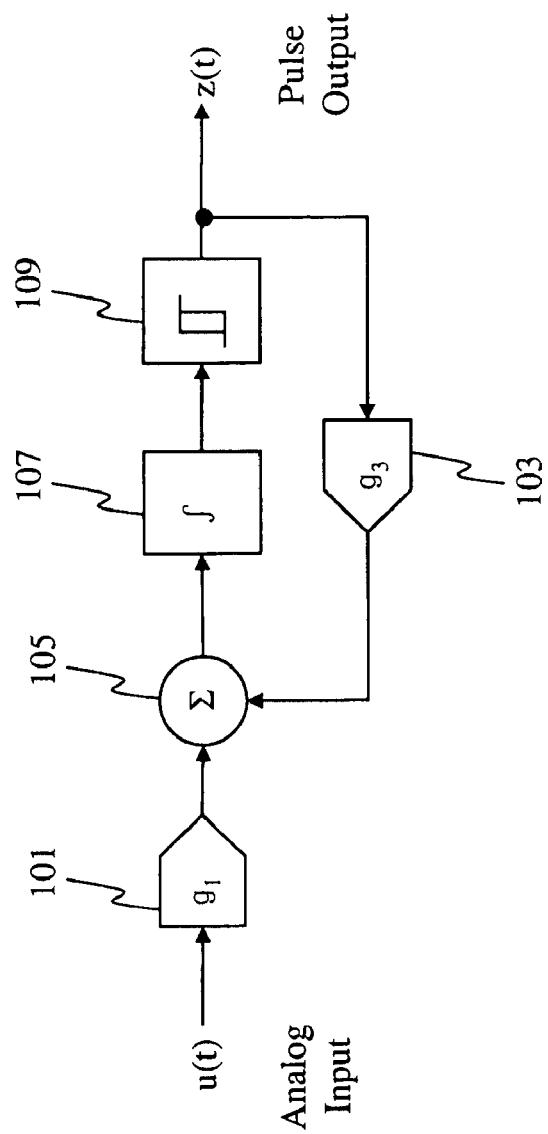
FIG. 1 is a block diagram of a conventional time encoder circuit.

The following description pertains to ordinary differential equations and systems of coupled first order linear ordinary differential equations or higher order linear ordinary differential equations that may be written as systems of coupled first order linear ordinary differential equations.

A first embodiment of the present invention provides a second order unit element circuit that is used to solve differential equations in the pulse domain. The circuit of the first embodiment is referred to as an encoder circuit. The encoder circuit computes an arbitrary first order differential equation with the solution projected in the time domain via a pulse output. The encoder circuit of the first embodiment does not require any analog feedback amplifier for performing this computation. All the internal feedback signals are pulse asynchronous signals being defined with just two amplitude levels. Simple 1-bit Digital to Analog Converters (DACs) are used in the feedback circuit. Gain of the 1-bit DACs is used to set the coefficients of the desired differential equation to be solved. The 1-bit DACs are inherently linear because in these elements, one binary input produces one binary output. Conversely, analog feedback amplifiers are generally not linear. Therefore, when using 1-bit DACs, only two inputs are permitted that produce two outputs and two points define a line. Arrays of the encoder circuits can be combined to solve systems of linear coupled first order differential equations. The coupling coefficients are also controlled by gains of the 1-bit DACs that are used to provide feedback from one encoder circuit to another encoder circuit in the array.

In one exemplary embodiment, each elementary encoder circuit in the first embodiment includes one transconductance amplifier, two integrators, a hysteresis quantizer and two 1-bit DACs. The encoder circuit feedback signals and the encoder circuit output signals encode analog information in the time domain via asynchronous pulse signals with just two amplitude levels. The information in these signals is not quantized. The exemplary embodiment of the encoder circuit contains two feedback loops. An inner loop of the encoder circuit contains a time encoder circuit. Conventionally, individual time encoder circuits have been used to time-encode a single analog signal input into a single pulse output with no attempt to solve differential equations. The encoder circuit of the first embodiment of the invention takes an input and solves a differential equation on the input with the solutions being time-encoded. The solution of the differential equation and the time encoding are performed simultaneously. The feedback signals are pulse signals with only two amplitude values, the information being encoded in the timing of the signals. An encoded pulse output provides the desired solution substantially without quantization error.

The encoder circuit of the first embodiment of the invention reduces or avoids the accuracy limitation of the analog computing and the speed limitation of the ADC conversion. Assuming ideal elements, the encoder circuit of the first embodiment provides an exact solution. In addition, the implementation of the encoder circuit is more compact than an equivalent analog circuit or a digital circuit. The encoder circuit may be implemented in compact VLSI circuits. The encoder circuit components, such as hysteresis quantizers, integrators, and 1-bit DACs, are simple and intrinsically-linear.

FIG. 1 is a block diagram of a conventional time encoder circuit.

The conventional encoder circuit includes an input amplifier 101, an adder 105, an integrator 107, and a non-inverting Schmitt trigger 109 that are coupled together in series and a feedback amplifier 103 that provides a feedback loop from an output of the Schmitt trigger 109 to the adder 105. The conventional encoder circuit has a single analog input u(t), being input to the input amplifier 101, and a single pulse output z(t), being output from the Schmitt trigger 109. The conventional encoder circuit encodes analog input signals into pulse signals. If the analog input signal u(t) is bandlimited the encoding can be without loss of information. That is, the input u(t) can be recovered from the timing of the pulse output signal z(t).

The conventional encoder circuit of FIG. 1 allows transforming an analog signal such as the input signal u(t) into an asynchronous pulse signal z(t). A time decoding machine can be used to perfectly recover the analog input u(t) from the asynchronous pulse output z(t). The conventional encoder circuit of FIG. 1 is a first-order circuit in the sense that it contains the one integrator 107. This circuit does not perform any computation on the input signal u(t) besides the encoding transformation.

Figure 2:
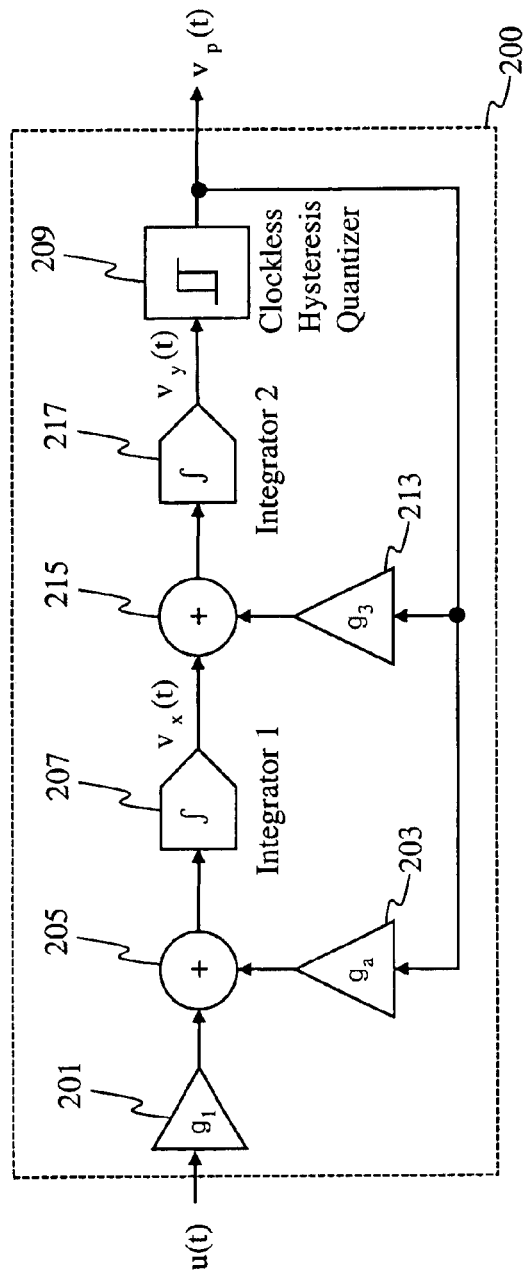
FIG. 2 is a block diagram of an encoder circuit according to the embodiments of the invention.

FIG. 2 is a block diagram of a second order unit element circuit 200 according to the embodiments of the invention. The second order unit element circuit 200 may also be referred to as an encoder circuit 200.

The encoder circuit 200 of FIG. 2 includes two integrators, one input amplifier, one clockless hysteresis quantizer, and two feedback asynchronous 1-bit DACs. An input amplifier 201, a first adder 205, a first integrator 207, a second adder 215, a second integrator 217, and a hysteresis quantizer 209 are coupled together in series. A first feedback loop is provided from the output of the circuit through a first 1-bit DAC 203 to the first adder 205 and a second feedback loop is provided from the output of the circuit through a second 1-bit DAC 213 to the second adder 215. The input amplifier 201 has a gain of $g_1$, the first 1-bit DAC 203 has a gain of $g_a$, and the second 1-bit DAC 213 has a gain of $g_3$. The analog input to the encoder circuit 200 is u(t), an output of the first integrator 207 is $V_x(t)$, an output of the second integrator 217 is $V_y(t)$ and output of the encoder circuit 200 is $V_p(t)$.

All of the elements mentioned above are continuous-time analog elements. The circuit of FIG. 2 achieves analog implementation without quantization error. The 1-bit DACs 203, 213 operate with input and output signals that have only two possible amplitude values. These elements are, therefore, inherently linear. The encoder circuit 200 does not require the feedback of any analog signal. All the internal feedback signals are pulse asynchronous signals $V_p(t)$. The encoder circuit 200 of the invention may be used to solve the following differential equation:

$$d[x(t)]/dt = g_a \cdot x(t) + g_1 \cdot u(t) \qquad \text{Equation 1}$$

The analog input is u(t) and the equation coefficients $g_1$ and $g_a$ correspond to the gains of the input amplifier 201 and the first feedback 1-bit DAC 203. The desired solution x(t) is time encoded in the pulse output $V_p(t)$ and may be recovered by a time decoder.

Figure 3:
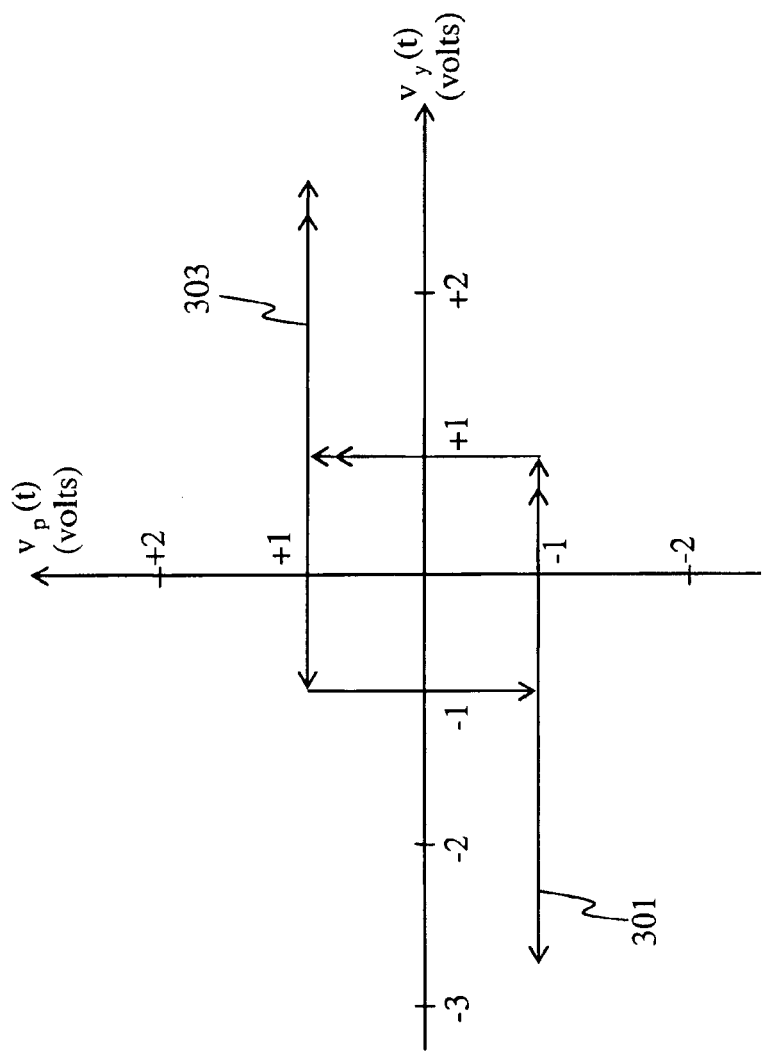
FIG. 3 is a plot of an output-input characteristic curve of a hysteresis quantizer used in the encoder circuit of FIG. 2.

FIG. 3 is a plot of an output-input characteristic curve of the hysteresis quantizer used in the circuit of FIG. 2.

FIG. 3 plots the output $V_p(t)$ of the hysteresis quantizer 209 versus the input $V_y(t)$ to this element where both input and output voltages are in volts. There are only two possible output levels, −1V and +1V that are shown on the vertical axis of the plot. The transition between the two output levels occurs at two different input trigger voltage levels depending on the history of the input. In the example shown, these trigger voltage levels are normalized to −1V and +1V that are shown on the horizontal axis of the graph. All these values can be scaled, as best suited for a particular VLSI implementation, without changing the basic operation of the encoder circuit 200.

In FIG. 3, as the input voltage $V_y(t)$ to the hysteresis quantizer 209 increases from a negative large number to +1V, the output voltage $V_p(t)$ of the hysteresis quantizer 209 remains constant at −1V shown by the line 301. Once the input voltage $V_y(t)$ exceeds the quantization voltage of +1V, the output $V_p(t)$ changes from −1V to +1V. The increase from a negative voltage to a positive voltage is indicated with double arrows on line 301 and the corresponding jump in the output from −1 to +1 is also shown with double arrows. However, if the input voltage $V_y(t)$ starts at a large positive voltage as shown by line 303 and is decreased to +1V, the output $V_p(t)$ does not return to −1V at the input level that previously caused the change in output. The history of the input voltage impacts the output voltage. In the exemplary characteristics curve of FIG. 3, an input voltage starting from a large positive value must be further reduced to −1V before the output reflects the change in the input and drops to −1V. The decrease from a positive voltage to a negative voltage is indicated with a single arrow on line 301 and the corresponding jump in the output from +1V to −1V is also shown with a single arrow.

Figure 4:
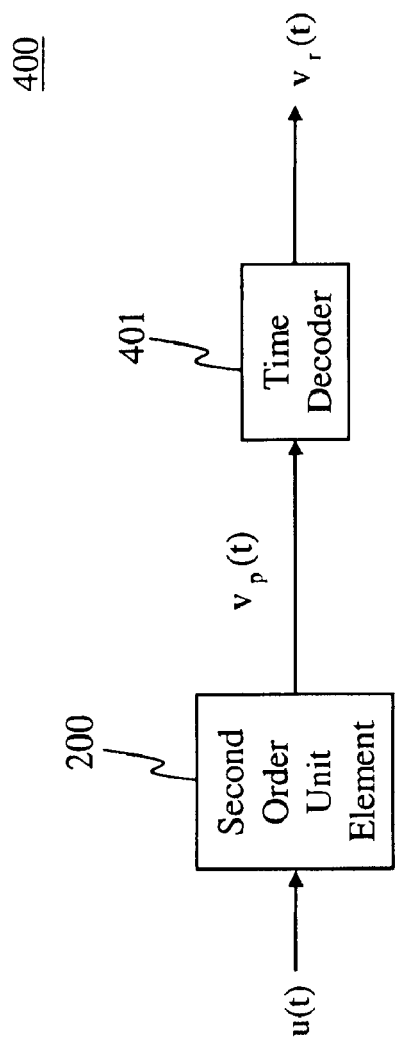
FIG. 4 is a block diagram of a setup to evaluate performance of the encoder circuit of FIG. 2 in series with a time decoder.

FIG. 4 is a block diagram of a setup to evaluate performance of the second order unit element or the encoder circuit 200 of FIG. 2. A setup of the encoder circuit 200 followed by a time decoder 401 together form an evaluator circuit 400.

The time decoder 401 can be used to convert the pulse output $V_p(t)$ into a recovered signal $V_r(t)$. Depending on the recovery algorithm used, the recovered signal $V_r(t)$ can be a collection of samples generally irregularly spaced as a function of time or a regular analog signal continuous in amplitude and in time.

Figure 5:
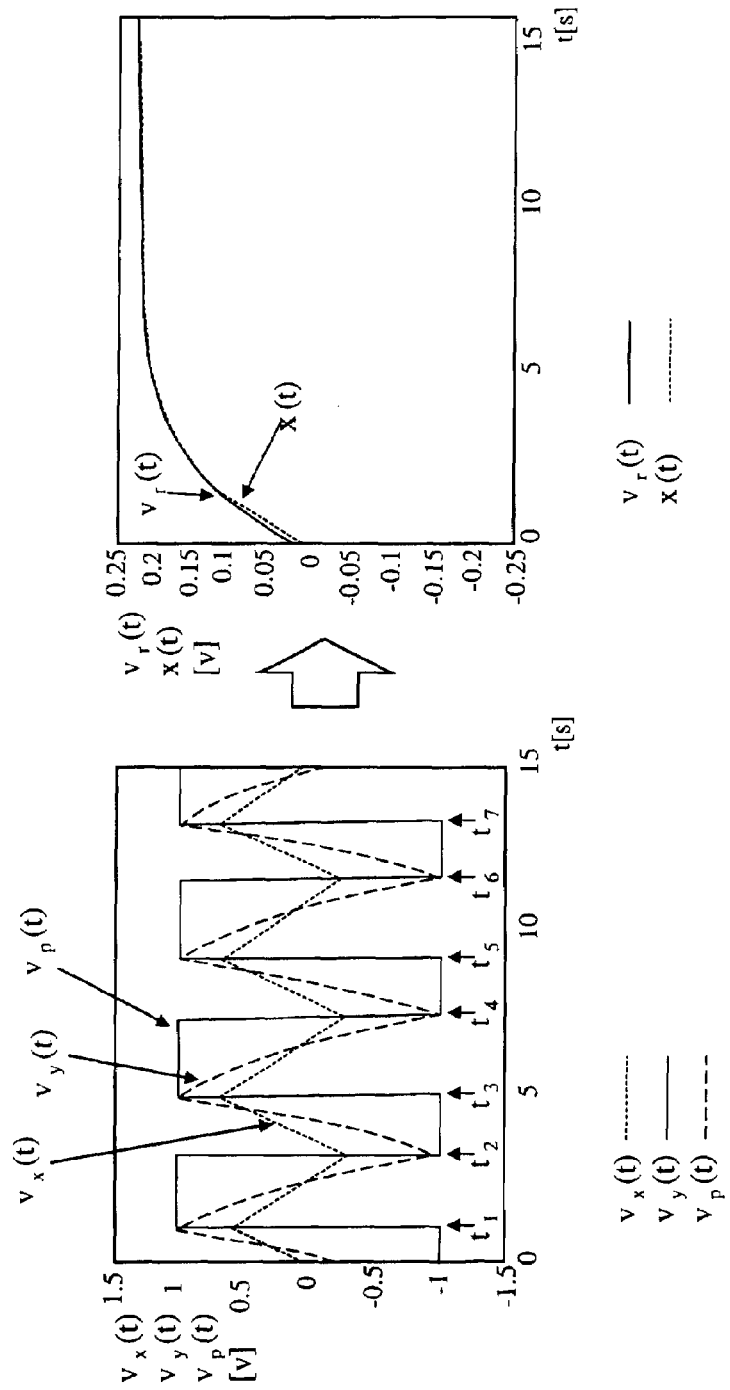
FIG. 5A is a plot of exemplary output signals of various elements of the encoder circuit of FIG. 2 versus time.
FIG. 5B is plot of an exemplary recovered signal of the time decoder of FIG. 4 versus time.

FIG. 5A is a plot of exemplary output signals $V_x(t)$, $V_y(t)$, $V_p(t)$ of various elements of the encoder circuit 200 of FIG. 2 versus time. FIG. 5B is a plot of an exemplary recovered signal $V_r(t)$ of the time decoder 401 of FIG. 4 versus time.

FIGS. 5A and 5B show an exemplary operation of the evaluator circuit 400, shown in FIG. 4, that is used to solve the differential equation given above as Equation 1. In this example, the input signal is assumed to be a constant u(t)= 0.1V, the initial condition at time zero is x(0)=0, and the coefficients of the differential equation are $g_a$=0.5 and $g_1$=1.

FIG. 5A shows the waveforms of the $V_x(t)$ that is the output of the first Integrator 207, $V_y(t)$ that is the output of the second integrator 217, and $V_p(t)$ that is the output of the hysteresis quantizer 209 versus time. The output signals are in units of volts and the time is in units of seconds. The output signal $V_p(t)$, is quantized to just two possible values that are set by the hysteresis quantizer circuit parameters. In the exemplary embodiment shown, the hysteresis quantizer parameters are −1V and +1V to conform to the plot of FIG. 3. The timing of the pulse transitions are denoted $t_k$ where k is an index taking values of 1, 2, . . . , n. The values of the $t_k$ are not quantized. The intermediate output signals $V_x(t)$ and $V_y(t)$ are not quantized to two discrete values and are shown to each have a saw tooth shape. The maxima of the saw tooth curves of $V_x(t)$ and $V_y(t)$ coincide with the step ups of the output signal $V_p(t)$ and the minima of the saw tooth curves coincide with the step downs of the output signal $V_p(t)$.

FIG. 5B shows a plot of $V_r(t)$ in volts versus time in seconds. The exemplary $V_r(t)$ that is shown has been generated from signal $V_p(t)$ by using a conventional pulse-to-analog time decoding algorithm. The input signals $V_p(t)$ for producing the recovery signal $V_r(t)$ shown in FIG. 5B are the values of the $V_p(t)$, corresponding to $t_k$, that are generated from the encoder circuit 200 by conducting a simulation from t=0 to t=100 s. Only the results of the first 15 s of the simulation are shown in the plots of FIGS. 5A and 5B. The ideal target solution x(t) of the differential equation being solved is also shown for comparison. As shown in FIG. 5B, the two waveforms $V_r(t)$ and x(t) are virtually identical. The only noticeable difference appears around initial time 0 s and is due to the finite accuracy of the recovery algorithm at the edges of the recovery window.

Figure 6:
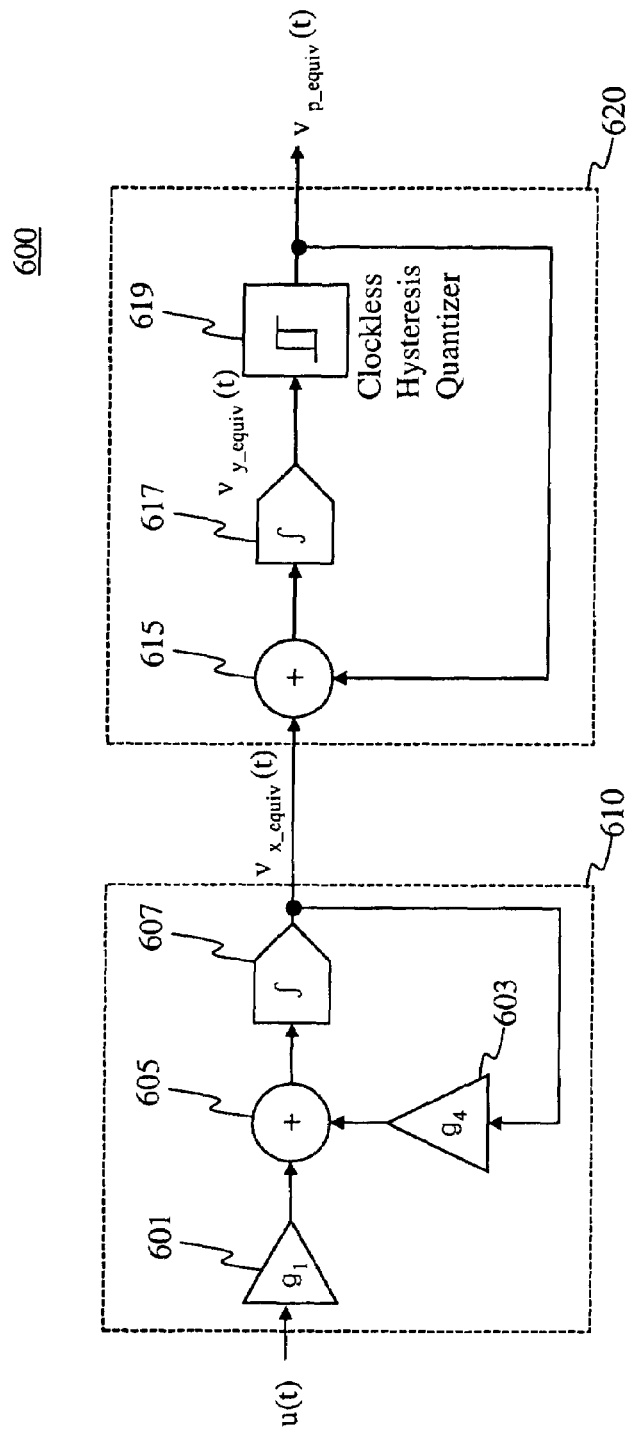
FIG. 6 is a block diagram of an equivalent circuit for the encoder circuit of FIG. 2.

Performance of the encoder circuit 200 of the invention may also be evaluated by comparing the operation of this circuit to a circuit including an ideal analog feedback stage followed by a time encoder. FIG. 6 is a block diagram of an ideal circuit 600 that is equivalent to the second order encoder circuit 200 of the embodiments of the invention shown in FIG. 2.

The ideal equivalent circuit 600 includes an ideal analog feedback stage 610 followed by a time encoder 620.

The ideal analog feedback stage 610 includes an input amplifier 601, an adder 605 and an integrator 607 coupled together in series. An analog linear amplifier 603 with a gain $g_A$ is used in the first feedback loop and provides feedback from an output of the integrator 607 to the adder 605. The analog input signal u(t) is input to the input amplifier 601 and the intermediate output signal from the integrator 607 is $V_{x-equiv}(t)$.

The time encoder 620 includes an adder 615, an integrator 617, and a clockless hysteresis quantizer 619 coupled together in series. A feedback loop is provided from an output of the hysteresis quantizer 619 to the adder 615. The output $V_{x-equiv}(t)$ of the ideal analog feedback stage 610 is input to the adder 615 of the time encoder 620. An intermediate output $V_{y-equiv}(t)$ is output from the integrator 617 and input to the hysteresis quantizer 619. The time encoder has an output signal $V_{p-equiv}(t)$ from the hysteresis quantizer 619.

Using the same exemplary parameter values as used in evaluation setup of FIG. 4, the performance of the ideal equivalent circuit 600 is evaluated.

Figure 7A:
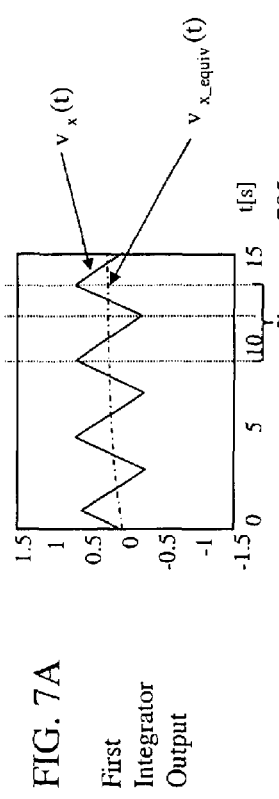
FIG. 7A, FIG. 7B, and FIG. 7C are plots showing a comparison between simulation results for the encoder circuit of FIG. 2 and the equivalent circuit of FIG. 6.
Figure 7B:
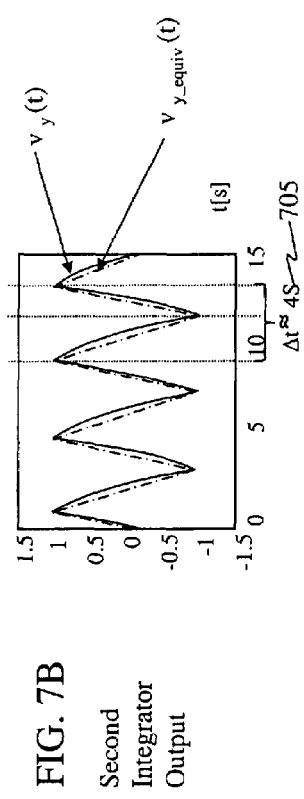
Figure 7C:
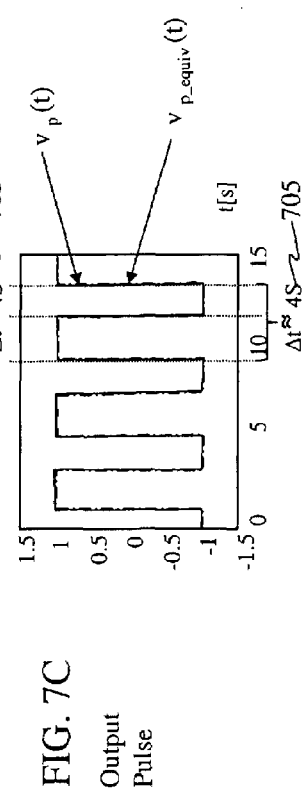

FIG. 7A, FIG. 7B, and FIG. 7C plot the output signals $V_{x-equiv}(t)$ $V_{y-equiv}(t)$, and $V_{p-equiv}(t)$ versus time and show a comparison between simulation results of the encoder circuit 200 of FIG. 2 and the ideal equivalent circuit 600 of FIG. 6.

The two signals $V_{x-equiv}(t)$ and $V_{y-equiv}(t)$ are integrator outputs and $V_{p-equiv}(t)$ is the output signal of the overall circuit 600. FIG. 7A plots both $V_x(t)$, that is the output of the first integrator 207 of the encoder circuit 200, and $V_{x-equiv}(t)$, that is the output of the integrator 607 of the circuit 600, versus time. FIG. 7B plots $V_y(t)$ of the encoder circuit 200 and $V_{y-equiv}(t)$ of the circuit 600 versus time. FIG. 7C plots $V_p(t)$ of the encoder circuit 200 and $V_{p-equiv}(t)$ of the circuit 600 versus time. It can be observed that even though the intermediate outputs $V_x(t)$, $V_{x-equiv}(t)$ and $V_y(t)$, $V_{y-equiv}(t)$ are different for the circuits 200, 600 the final pulse outputs and $V_p(t)$, $V_{p-equiv}(t)$ are the same and their corresponding curves overlap.

The above comparison indicates that the encoder circuit 200 of the embodiments of the invention produces substantially the same output as the circuit 600 which includes the ideal analog feedback stage 610. The encoder circuit 200, however, only requires simple feedback DACs instead of analog amplifiers such as the analog amplifier 603. In the exemplary simulation whose results were shown in FIGS. 7A, 7B, and 7C, a constant input signal u(t) was used. The equivalency of the two circuits 200, 600 may also be shown for other types of input signals such as sinusoidal, pulse, and random bandlimited input signals.

The encoder circuit 200 of the embodiments of the invention is well suited for high speed operation. In the example shown in FIG. 7C, using normalized unitary values for all circuit components, the cycle time 705 has a normalized value of about 4 s. The normalized values may be scaled according to the technology. As an example, using a fast current IC technology in InP, the cycle time may be shorter than 50 ps. In this technology the second order unit element circuit can solve differential equations and perform time encoding of analog signals with bandwidths of close to 20 GHz The encoder circuit 200 of FIG. 2 may be used to solve one first order differential equation such as Equation 1 above. To solve systems of two or more linear first order differential equations, an array of the second order unit element circuits may be used.

Figure 8A:
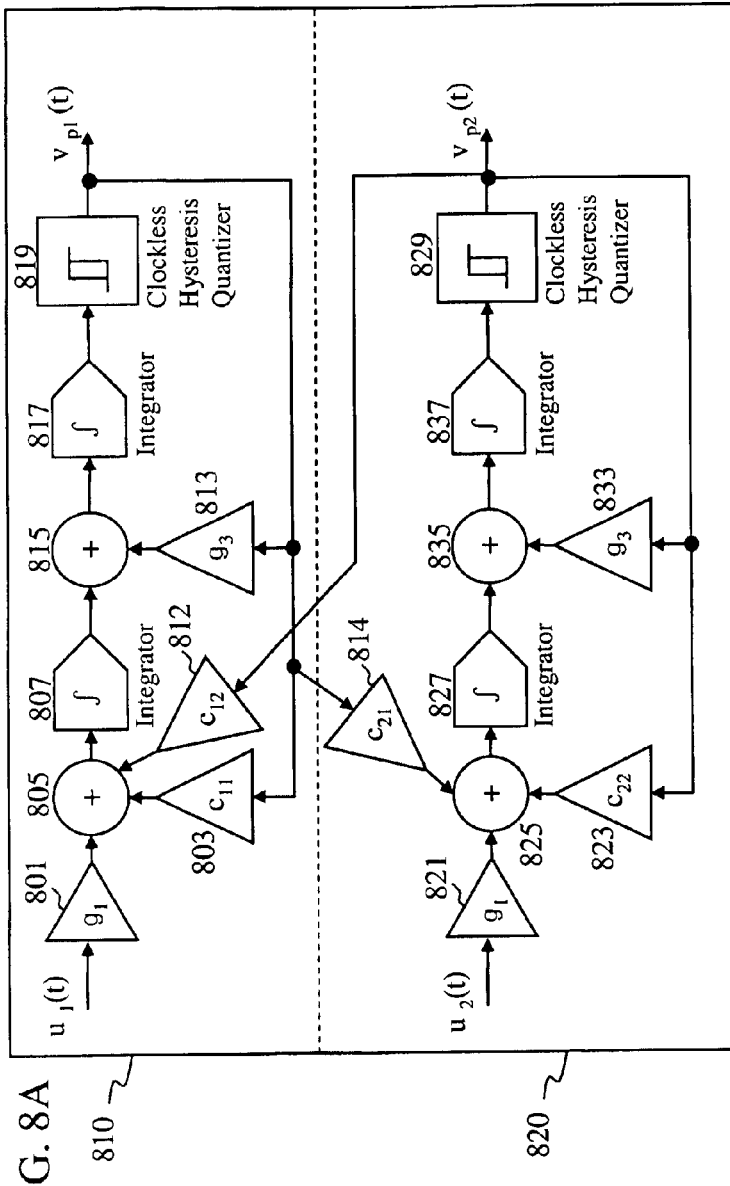

FIG. 8A is a block diagram of a circuit 800 used to solve a system of differential equations according the embodiments of the invention and FIG. 8B shows a system of two coupled linear first order differential equations capable of being solved by the circuit of FIG. 8A.

The circuit 800 includes two second order unit element sub-circuits 810, 820. A first sub-circuit 810 receives a first input $u_1(t)$ and generates an output $V_{p1}(t)$ and a second sub-circuit 820 receives a second input $u_2(t)$ and generates an output $V_{p2}(t)$. The two outputs $V_{p1}(t)$ and $V_{p2}(t)$ may be used to recover the solutions $x_1(t)$ and $x_2(t)$ to a system of two linear first order differential equations.

The two sub-circuits 810, 820 are cross-coupled through 1-bit DACs 812, 814. The cross-coupling feeds the pulse-type asynchronous signal output of one sub-circuit to the other sub-circuit. For example, $V_{p1}(t)$ is fed through the 1-bit DAC 814 to the sub-circuit 820 and $V_{p2}(t)$ is fed through the 1-bit DAC 812 to the sub-circuit 810.

Each sub-circuit 810, 820 is similar to the encoder circuit 200 of FIG. 2. Each sub-circuit 810, 820 includes an input amplifier 801, 821, coupled in series with a first adder 805, 825, a first integrator 807, 827, a second adder 815, 835, a second integrator 817, 837, and a hysteresis quantizer 819, 829. The input signal $u_1(t)$ is input to the input amplifier 801 of the first sub-circuit 810 and the input signal $u_2(t)$ is input to the input amplifier 821 of the second sub-circuit 820. A first feedback loop carries the output signal $V_{p1}(t)$, $V_{p2}(t)$ to the first adder 805, 825 through a first 1-bit DAC 803, 823 and a second feedback loop carries the output signal through a second 1-bit-DAC 813, 833 to the second adder 815, 835. The cross-coupling 1-bit DAC 812 couples the output $V_{p2}(t)$ of the second sub-circuit 820 to the first adder 805 of the first sub-circuit 810. The cross-coupling 1-bit DAC 814 couples the output $V_{p1}(t)$ of the first sub-circuit 810 to the first adder 825 of the second sub-circuit 820.

The coefficients $c_{ij}$ of the system of differential equations shown in FIG. 8B correspond to gains of the 1-bit DACs of FIG. 8A. The first 1-bit DACs 803, 823 of each sub-circuit 810, 820 have gains that are equal to the diagonal coefficients $c_{11}$, $c_{22}$. The cross-coupling 1-bit DAC 812 has a gain of $c_{12}$ and the cross-coupling 1-bit DAC 814 has a gain of $c_{21}$.

The outputs $V_{p1}(t)$ and $V_{p2}(t)$ of the sub-circuits 810, 820 of FIG. 8A correspond to a time encoding of the solutions $x_1(t)$ and $x_2(t)$ of the equations given in FIG. 8B. The solutions $x_1(t)$ and $x_2(t)$ of the system of differential equations may therefore be recovered from the time-encoded outputs $V_{p1}(t)$ and $V_{p2}(t)$.

The circuit 800 of FIG. 8A may be used for several types of the input signals. Further, the circuit 800 may include an array of N second order unit elements to solve a system of N coupled linear first order differential equations. A system of N coupled differential equations requires $N^2$ coefficients that may be implemented by $N^2$ of 1-bit DACs. An $N^{th}$ order linear differential equation may also be implemented as a system of N coupled differential equations as shown with respect to the description of FIG. 11 below where higher order derivatives may be represented as separate state variables.

Figures 9A, 9B:
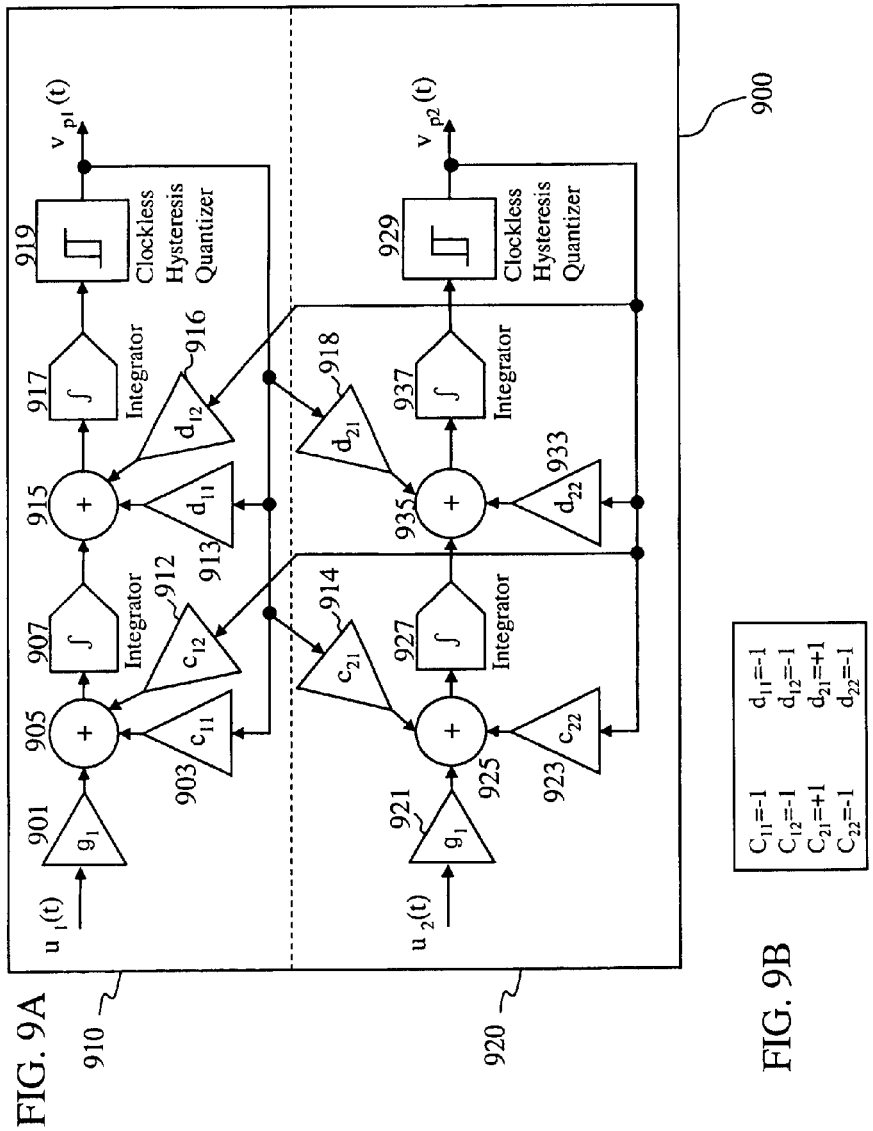
FIG. 9A is a block diagram of a Hadamard gate for use with either analog inputs or pulse inputs according to the embodiments of the invention and FIG. 9B shows the circuit parameters of the circuit of FIG. 9A.

FIG. 9A is a block diagram of a Hadamard gate 900 for use with either analog inputs or pulse inputs and FIG. 9B shows the circuit parameters of the circuit of FIG. 9A.

The Hadamard gate circuit of the invention includes an array of second order unit element circuits to be used to implement a Hadamard gate that operates with either analog inputs or pulse time-encoded inputs. Hadamard gates take 2 inputs, a and b. They are capable of performing two arithmetic operations on these inputs. These operations are the average (a+b)/2 and the half of the difference (a−b)/2. Prior implementations of the Hadamard gate only operate with analog inputs and not with pulse inputs.

FIG. 9A shows the Hadamard gate 900 of the invention including two of the second order unit element circuits 200 of the invention coupled together with a feedback structure. A total of 8 feedback 1-bit DACs are used in the exemplary embodiment shown. FIG. 9B shows the fixed gains for these DACs.

The exemplary Hadamard gate 900 of FIG. 9A includes two second order unit element circuits as first and second sub-circuits 910, 920 of the overall Hadamard gate that are coupled together by four 1-bit DACs 912, 914, 916, 918. The sub-circuits 910, 920 each include an input amplifier 901, 921, coupled in series with a first adder 905, 925, a first integrator 907, 927, a second adder 915, 935, a second integrator 917, 937, and a hysteresis quantizer 919, 929. The input signal $u_1(t)$ is input to the input amplifier 901 of the first sub-circuit 910 and the input signal $u_2(t)$ is input to the input amplifier 921 of the second sub-circuit 920. A first feedback loop carries an output signal $V_{p1}(t)$, $V_{p2}(t)$ to the first adder 905, 925 through a first 1-bit DAC 903, 923 and a second feedback loop carries the output signal through a second 1-bit-DAC 913, 933 to the second adder 915, 935 of each sub-circuit 910, 920. The cross-coupling 1-bit DACs 912 and 916 couple the output $V_{p2}(t)$ of the second sub-circuit 920 respectively to the first adder 905 and the second adder 915 of the first sub-circuit 910. The cross-coupling 1-bit DACs 914, 918 couple the output $V_{p1}(t)$ of the first sub-circuit 910 respectively to the first adder 925 and the second adder 935 of the second sub-circuit 920.

The first amplifiers 901, 921 of each sub-circuit have a gain $g_1$. The gain of the feedback 1-bit DACs is as follows: a gain of $c_{11}$ for 903, $d_{11}$ for 913, $c_{22}$ for 923, $d_{22}$ for 933, $c_{12}$ for 912, $d_{12}$ for 916, $c_{21}$ for 914, and $d_{21}$ for 918. The input $u_1(t)$ provides the input a and the input $u_2(t)$ provides the input b for the Hadamard gate 900. The output $V_{p1}(t)$ provides the output (a+b)/2 and the output $V_{p2}(t)$ provides the output (a−b)/2 of the Hadamard gate 900. The input $u_1(t)$ may be a time-encoded pulse signal encoding the analog value a. The input $u_2(t)$ may be a time-encoded pulse signal encoding the analog value b. The output $V_{p1}(t)$ may be a time-encoded pulse signal encoding the analog value (a+b)/2. The output $V_{p2}(t)$ may be a time-encoded pulse signal encoding the analog value (a−b)/2.

FIG. 10A, FIG. 10B, FIG. 10C, and FIG. 10D show plots of the two input pulses $u_1(t)$ and $u_2(t)$ to the circuit of FIG. 9A and the two output pulses $V_{p1}(t)$ and $V_{p2}(t)$ from the circuit of FIG. 9A.

Figure 10B:
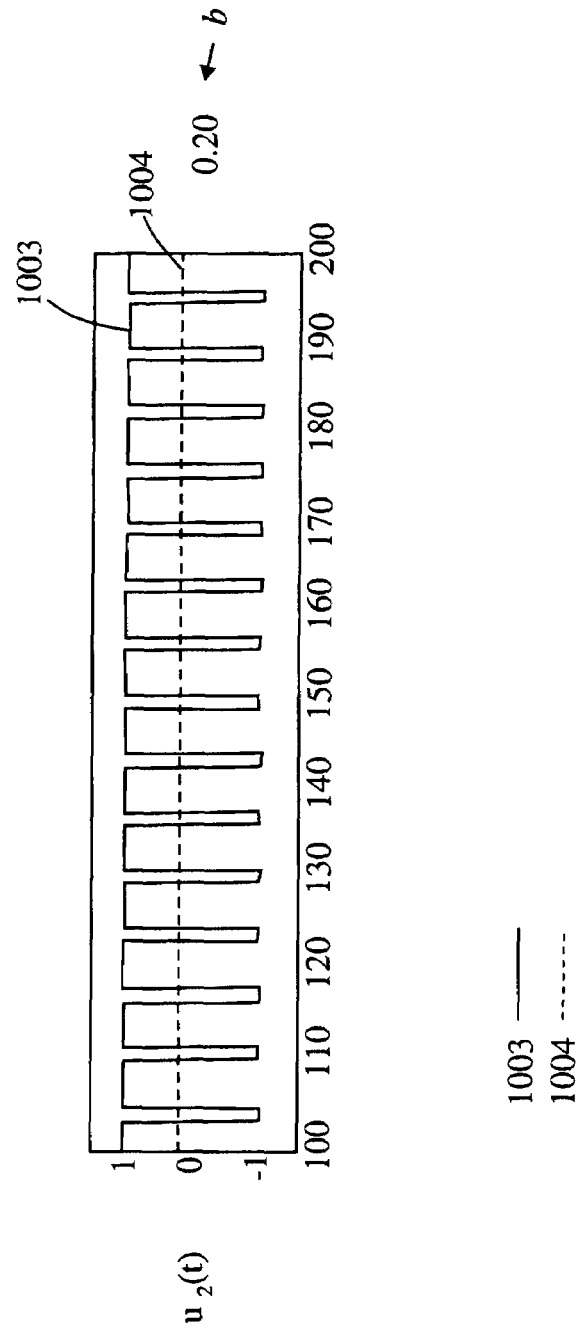
Figure 10C:
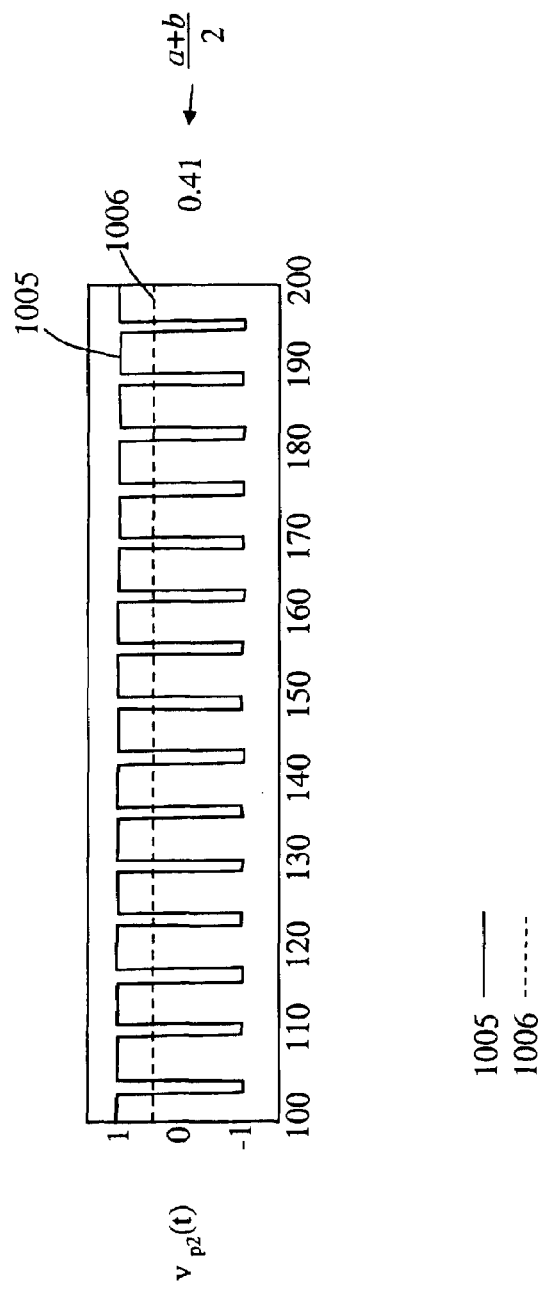
Figure 10D:
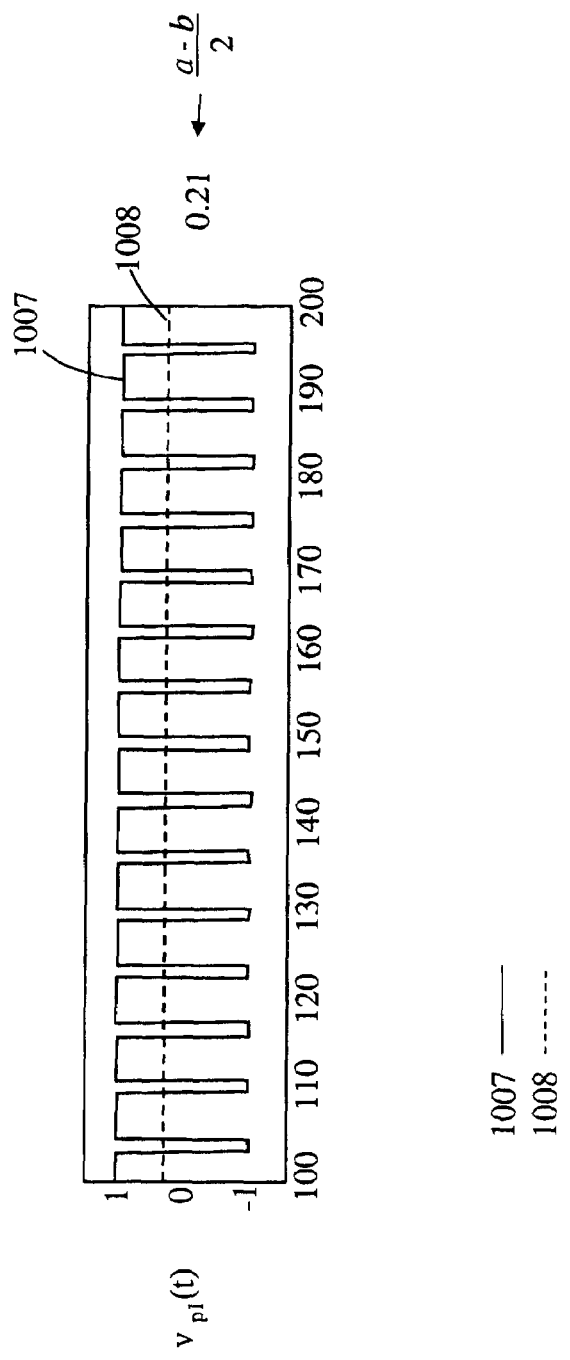

The two inputs to the circuit 900 are both pulse inputs as FIG. 10A of $u_1(t)$ and FIG. 10B of $u_2(t)$ indicate. The pulse input $u_1(t)$ encodes a constant analog value of the parameter a=0.62 and the pulse input $u_2(t)$ encodes a constant analog value of the parameter b=0.20 of the Hadamard circuit. In FIGS. 10A and 10B, a pulse line 1001, 1003 shows the actual pulse signals $u_1(t)$, $u_2(t)$ and a constant line 1002, 1004 shows the value 0.62, 0.2 encoded in the input pulse. Exemplary simulation results of the Hadamard gate circuit 900 are reflected in FIGS. 10C and 10D. In FIG. 10C a pulse line 1005 shows the pulse output $V_{p1}(t)$ that encodes the output (a+b)/2 shown by a constant line 1006. In FIG. 10D a pulse line 1007 shows the pulse output $V_{p2}(t)$ that encodes the output (a−b)/2 shown by a constant line 1008. All plots are versus time in seconds. The two pulse outputs 1005, 1007 time encode the results of the two desired Hadamard arithmetic operations. In this example the encoded value at one output is (0.62+0.20)/2 which corresponds to 0.41 shown with the line 1006. The encoded value at the other output is (0.62−0.20)/2 which corresponds to 0.21 shown with the line 1008.

Because both the inputs and the outputs are time encoded, the Hadamard gate according to the embodiments of the invention may be cascaded. The Hadamard gate of the embodiments of the invention provides the capability of performing generic arithmetic operations in the time domain. The Hadamard gate of the invention operates properly for time varying signals.

The circuit 800 of FIG. 8A may be used as a basic component to produce a pulse-input pulse-output squaring gate and a product, or mixing, gate. The square and product gates may be built by using the Hadamard gate 900 of the present application in the structure described in the analog-input case of the "Pulse Domain Hadamard Gate" disclosure by the inventors of the present invention and assigned to the assignee of the current application that is incorporated herein by reference.

Conventional time encoder circuits have been used to time-encode a single analog signal input into a signal pulse output without performing any filtering or any other processing. A second embodiment of the present invention implements an analog filter and is referred to as a filter circuit. The filter being implemented may have either a Finite Impulse Response (FIR) or an Infinite Impulse Response (IIR). The input to the filter can be an analog signal or a time encoded pulse signal. The output is time encoded as a pulse signal. The filter circuits of the second embodiment include integrators, hysteresis quantizers and 1-bit DACs. All the filter circuit internal feedback signals and the filter circuit output signal encode analog information in the time domain via asynchronous pulse signals with just two amplitude levels. The information in these signals is not quantized. The filter circuit of this invention does not require any analog feedback amplifier for implementing the filtering. Instead, 1-bit DACs are used in the feedback. The gain of the 1-bit DACs is used to set the coefficients of the desired filter to be implemented. The filter circuits are suitable for compact implementation in VLSI technology. The filter circuit of the second embodiment of the present invention takes an input and implements an arbitrary analog filter function where the solution is time-encoded. The filtering operation and the time encoding are performed simultaneously. The only feedback signals in the filter circuit are pulse signals with only two amplitude values, the information being encoded in the timing of the signals. The filter circuit does not require the use of feedback analog amplifiers. The encoded pulse output provides the desired filter solution substantially without quantization error.

As explained above the second order time encoder circuit 200 of FIG. 2 has a single analog input and a single pulse output and solves a differential equation and time encodes the solution into a pulse signal. The time encoding is according to the equations provided in Lazar and Toth. A time decoding machine may be used to decode the pulse output.

FIG. 11, FIG. 12, FIG. 13, and FIG. 14 show block diagrams of a filter circuit 1100 and its components according the embodiments of the invention. The filter circuit 1100 of the invention is used to implement a filter in the pulse domain.

Figure 11:
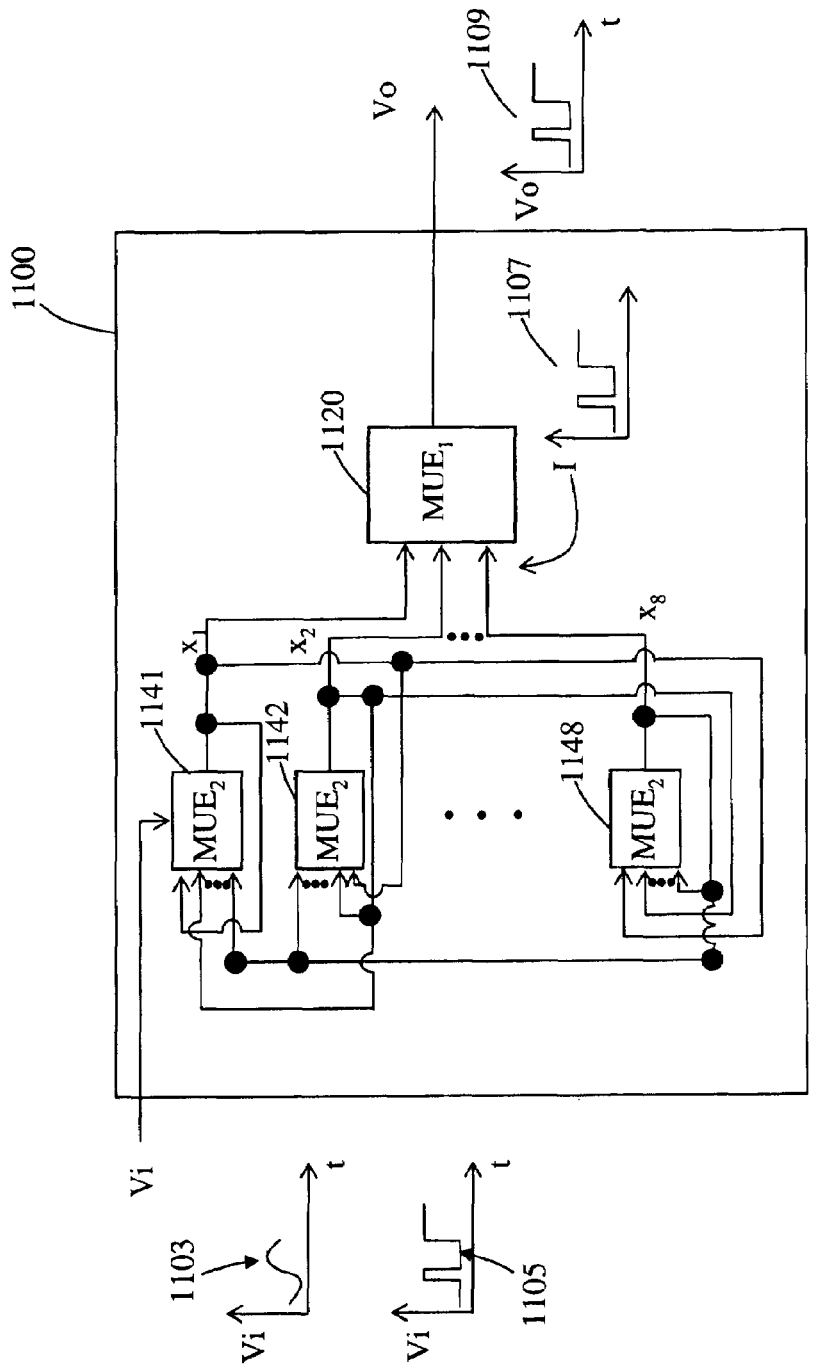
FIG. 11, FIG. 12, FIG. 13 and FIG. 14 show block diagrams of a filter circuit and its components according the embodiments of the invention.

FIG. 11 shows the architecture of the filter circuit 1100 of the invention. The exemplary embodiment shown in the drawings corresponds to the case of an $8^{th}$ order filter. Lower or higher order filters may be similarly implemented. The filter order is defined as the order of the denominator polynomial of the filter transfer function, or alternatively, as the total number of individual poles, either real or complex with each complex conjugate pole pair counted here as two individual poles. In the exemplary embodiment shown, there are 8 state variables $x_1 \ldots x_8$ and the filter may solve an $8^{th}$ order differential equation. A linear $8^{th}$ order differential equation may be written as a system of eight coupled linear first order differential equations with 8 state variables. Equation 2 shows the system of eight coupled linear first order differential equations that may be solved by the filter circuit 1100.

$$\frac{d[x_1(t)]}{dt} = c_{11}.x_1(t) + c_{12}.x_2(t) + c_{13}.x_3(t) + c_{14}.x_4(t) +$$
$$c_{15}.x_5(t) + c_{16}.x_6(t) + c_{17}.x_7(t) + c_{18}.x_8(t) + Vi$$

$$\frac{d[x_2(t)]}{dt} = c_{21}.x_1(t) + c_{22}.x_2(t) + c_{23}.x_3(t) + c_{24}.x_4(t) +$$
$$c_{25}.x_5(t) + c_{26}.x_6(t) + c_{27}.x_7(t) + c_{28}.x_8(t)$$

$$\frac{d[x_3(t)]}{dt} = c_{31}.x_1(t) + c_{32}.x_2(t) + c_{33}.x_3(t) + c_{34}.x_4(t) +$$
$$c_{35}.x_5(t) + c_{36}.x_6(t) + c_{37}.x_7(t) + c_{38}.x_8(t)$$

$$\vdots$$

$$\frac{d[x_8(t)]}{dt} = c_{81}.x_1(t) + c_{82}.x_2(t) + c_{83}.x_3(t) + c_{84}.x_4(t) +$$
$$c_{85}.x_5(t) + c_{86}.x_6(t) + c_{87}.x_7(t) + c_{88}.x_8(t)$$

Equation 2

In Equation 2, if the desired function is $x_1(t)$, then to obtain an 8 h order differential equation, the second state variable is set as $x_2(t)=d[x_1(t)]/dt$ such that $d[x_2(t)]/dt=d^2[x_1(t)]/dt^2$ is a second order derivative of the desired function $x_1(t)$ and similarly the eighth state variable is set as $x_8(t)=d[x_7(t)]/dt$ such that $d[x_8(t)]/dt=d^8[x_1(t)]/dt^8$ is an eighth order derivative of the desired function $x_1(t)$.

The filter circuit 1100 contains two types of internal blocks that are denoted as Multiple-Input Unit Element of First Order $MUE_1$ block 1120 and as Multiple-Input Unit Element of Second Order $MUE_2$ block 1141 to 1148.

Input to the filter circuit 1100 of the embodiments of the invention may be either an analog signal 1103 or a time encoded pulse signal 1105. Internal signals 1107 connecting all internal $MUE_2$ blocks 1141 to 1148 and the $MUE_1$ block 1140 are time encoded asynchronous pulse signals. These internal signals 1107 have only two amplitude levels. However, they can encode analog information in the timing of the pulses. Output signal 1109 is also a time encoded asynchronous pulse signal.

The internal signals 1107 may be pulse voltage or current signals where the information is encoded in the timing between pulses of voltage or current when the pulses may only take substantially the same two amplitude levels. The output signals 1109 may be pulse voltage signals where the information is encoded in the timing between pulses of voltage where the voltage pulses may only take substantially the same two amplitude levels.

For the case of an $8^{th}$ order filter, the filter circuit 1100 uses eight $MUE_2$ blocks 1141 to 1148 and one $MUE_1$ block 1120. The input signal 1103, 1105 is fed into one of the $MUE_2$ blocks. Each of the eight $MUE_2$ blocks generates one state asynchronous pulse signal, $x_i$ (i=1 ... 8). The eight state pulse signals $x_i$ are recurrently connected to the inputs of the $MUE_2$ blocks and also connected to the inputs of the final $MUE_1$ block.

Figure 12:
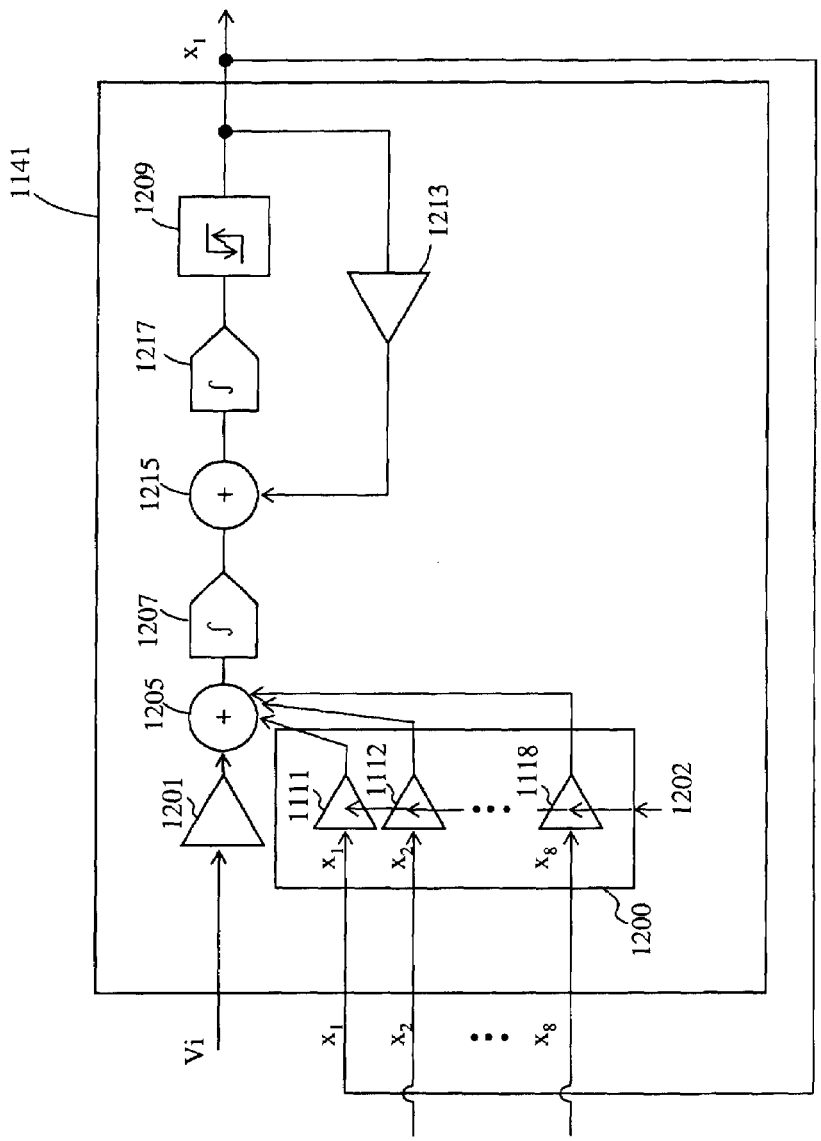
Figure 13:
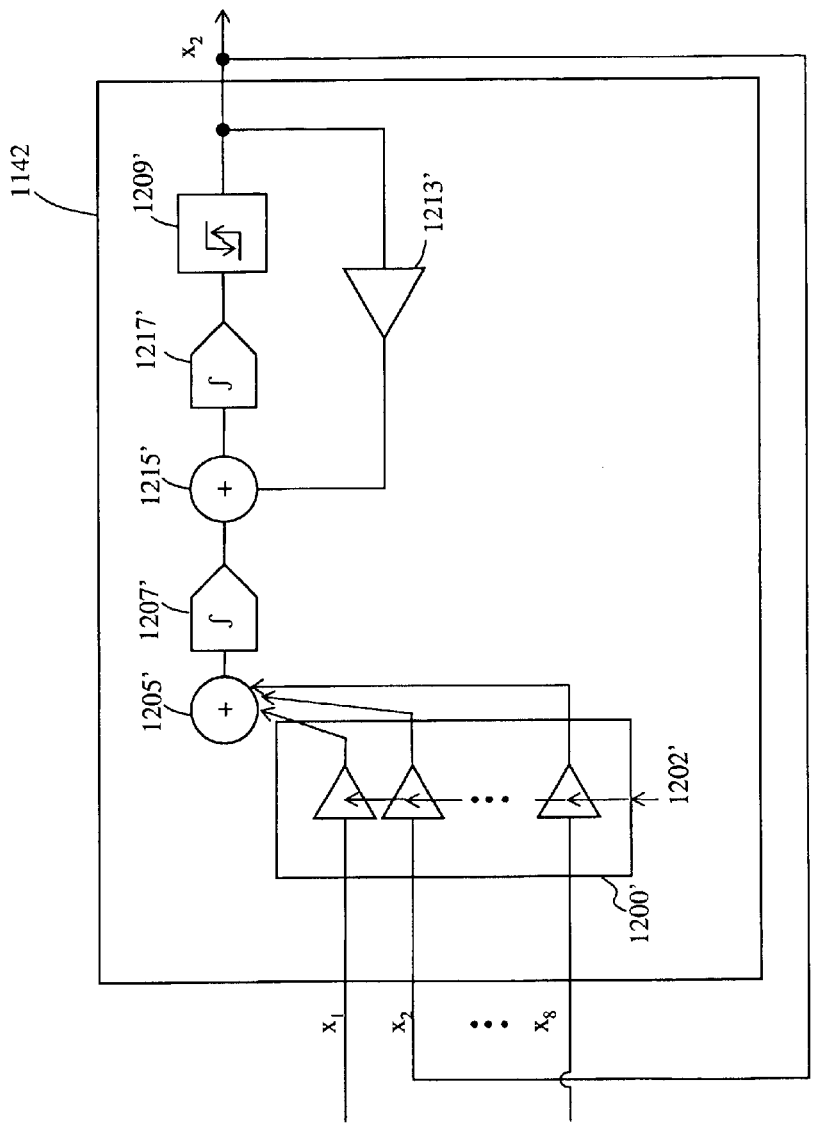

FIG. 12 shows a detailed block diagram of an exemplary first one of the $MUE_2$ blocks 1141. FIG. 13 shows a detailed block diagram of an exemplary $MUE_2$ block 1142 to 1148 other than the first block.

Each of the first to eighth exemplary $MUE_2$ blocks 1141 to 1148 includes two adders, two integrators, and a hysteresis quantizer that are coupled together in series, and a self-feedback 1-bit DAC that feeds the output of the hysteresis quantizer back to a second one of the adders. The exemplary $MUE_2$ block 1142 shown in FIG. 13 includes two adders 1205', 1215', two integrators 1207', 1217', a hysteresis quantizer 1209', and a self-feedback 1-bit DAC 1213' that feeds the output of the hysteresis quantizer 1209' back to the second adder 1215'.

As shown in FIG. 12, in addition to the components included in each of the $MUE_2$ blocks, the first $MUE_2$ block 1141 also contains an input gain cell 1201. When the input to the filter Vi is a time encoded signal this gain cell 1201 can be also implemented by a 1-bit DAC. The input gain cell 1201 included in the first $MUE_2$ block 1141 is similar to the input amplifier 201 of FIG. 2. In the exemplary embodiment shown, the second to eighth $MUE_2$ blocks 1141 to 1148 do not include the gain cell of the first $MUE_2$ block 1411 and do not receive the input signal Vi directly. This is shown in the detailed drawing of the first $MUE_2$ block 1141 in FIG. 13. In other embodiments, however, the input signal Vi may be directly provided to more than one of the $MUE_2$ blocks.

As shown in FIG. 12 and FIG. 13, each $MUE_2$ block 1141 to 1148 contains a bank 1200, 1200' of asynchronous cross-feedback 1-bit DACs. In FIG. 12, the bank 1200 of DACs includes eight cross-feedback DACs 1111 to 1118. Each cross-feedback DAC receives a corresponding one of the internal signals $x_i$. For example, the first cross-feedback DAC 1111 receives the input $x_1$ as a feedback from the first $MUE_2$ block 1141 and the last or eighth cross-feedback DAC 1118 receives the input $x_8$ from the eighth $MUE_2$ block 1148. For the exemplary embodiment shown, there are 8 $MUE_2$ blocks each containing 8 cross-feedback DACs for a total of 64 cross-feedback DACs.

Each of the DACs converts a pulse voltage signal, received at its input into a pulse current signal at its output. The transconductance gain of each DAC can be adjusted via a static digital control 1202. Adjustment of the DAC gains allows a user to program arbitrary filter transfer functions in the circuit 1100 of the embodiments of the invention. The DACs may be quite compact and accurate when implemented in VLSI.

Figure 14:
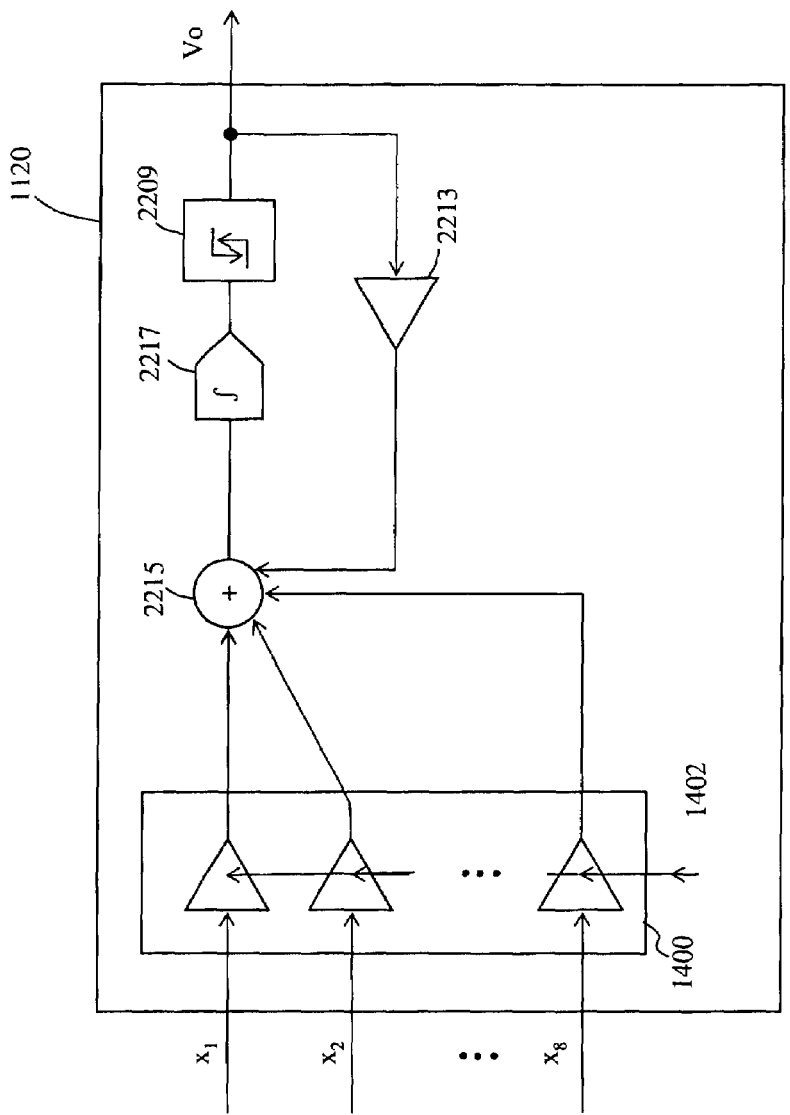

FIG. 14 shows a detailed block diagram of the $MUE_1$ block 1120. The $MUE_1$ block 1120 performs addition in the pulse domain. It contains a bank of programmable asynchronous 1-bit DACs 1400. Gain values of the DACs 1400 are also set to program arbitrary filter transfer functions in the circuit 1100 of the invention. The $MUE_1$ block 1120 also includes an adder 2215, an integrator 2217, a hysteresis quantizer 2209, and a self-feedback 1-bit DAC 2213. Outputs of the bank of 1-bit DACs 1400 are input to the adder 2215 and added together. The output of the adder 2215 is input to the integrator 2217, the output of the integrator 2217 is input to the hysteresis quantizer 2209. The output of the hysteresis quantizer 2209 is the output Vo 1109. The DACs within the bank of 1-bit DACs 1400 are controlled by a static digital control signal 1402 that is used to program the gain of each DAC.

As explained above, FIG. 3 shows the output-input characteristic of the hysteresis quantizers used in the $MUE_1$ block and the $MUE_2$ blocks of the filter of the embodiments of the invention. There are only two possible output levels of $-1V$ and $+1V$. They are shown on the vertical axis of the graph. The transition between the two output levels occurs at two different input trigger voltage levels depending on the history of the voltage. In the exemplary plot of FIG. 3, the trigger voltage levels are normalized to $-1V$ and $+1V$ and are shown on the horizontal axis of the graph. Both the trigger voltage and the output voltage values can be scaled, as best suited for a particular VLSI implementation, without changing the basic operation of the circuit.

Figure 15:
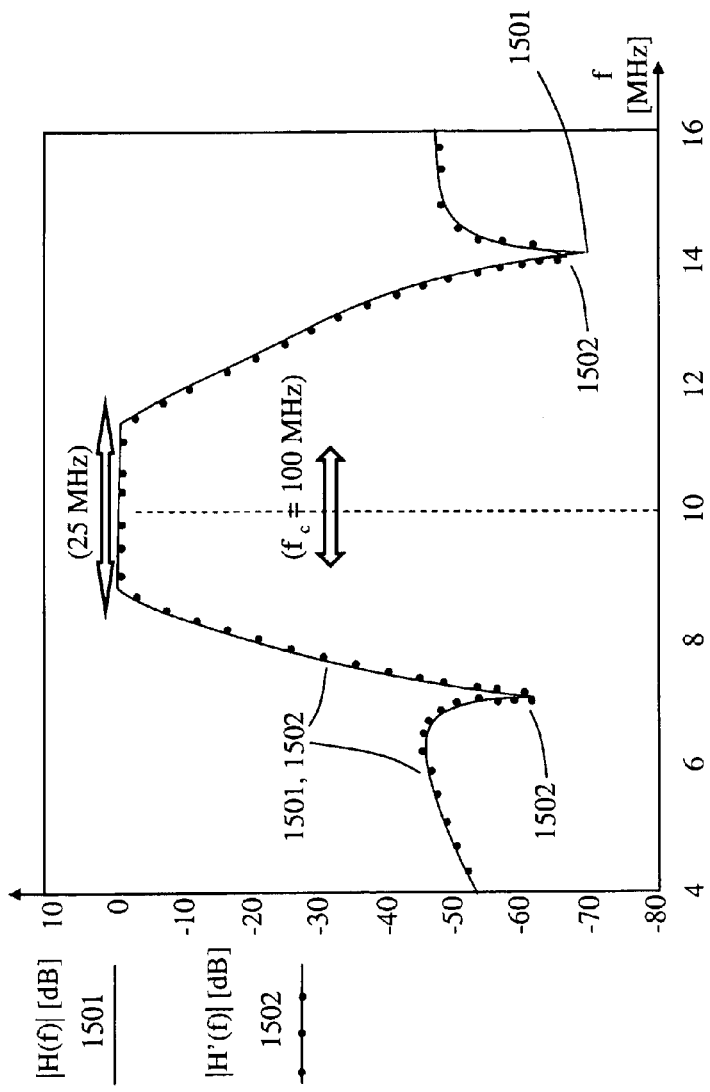
FIG. 15 is a plot of simulation results of the filter circuit of FIG. 11 and a comparison between the output of the filter circuit of FIG. 11 and an ideal target filter.

FIG. 15 is a plot of exemplary simulation results of the filter circuit 1100 of FIG. 11 and also provides a comparison between the output of the filter circuit of FIG. 11 and an ideal target filter. In this example an exemplary quasi-elliptic bandpass filter transfer function is implemented. Ideal and simulated transfer functions |H(f)| and |H'(f)| are shown on the vertical axis in units of dB versus frequency in MHz on the horizontal axis. Target ideal desired transfer function |H(f)| is labeled 1501 and the simulation results |H'(f)| using the filter 1100 of the embodiments of the invention is labeled 1502. The two curves overlap substantially over the entire range of frequencies shown. As a result, the ideal 1501 and simulated 1502 curves cannot be distinguished.

To produce the simulated curve 1502, the filter circuit 1100 was programmed by adjusting the 1-bit DAC gains. The filter circuit was then simulated in the time domain. An impulse input was applied to the input Vi of the circuit. The resulting pulse output Vo was the impulse response. A fast Fourier transform (FFT) of this output Vo was obtained to produce the filter transfer function H'(f). FIG. 15 shows that the resulting transfer function H'(f) is virtually identical to the ideal H(f). The filter simulated in FIG. 15 has a pass band of 25 MHz at a cutoff frequency $f_c$ of 100 MHz.

FIG. 15 shows the simulation results of only one exemplary implementation of the filter circuit 1100 of the embodiments of the present invention. A number of other transfer functions, including Butterworth, Chebychev, and Elliptic filter functions, may also be implemented using the embodiments of the filter circuit of the present invention. Low pass, high pass, band pass, band stop, and other arbitrary filters may be implemented using the filter circuit of the present invention. In fact, the circuit may implement any arbitrary transfer function. For all of the simulated cases the circuit response, in both the time domain and frequency domain, substantially coincides with the ideal response.

Further, various embodiments of the filter circuit of the invention are well suited for high speed operation. As an example, using a fast current IC technology in InP, the cycle time is lower than 50 ps. In this technology the $MUE_2$ bock circuit can solve differential equations and perform time encoding of analog signals with GHz bandwidths.

The first embodiment of the present invention, uses the second order circuit to perform arithmetic operations when the inputs are either analog signals or pulse signals. The first embodiment includes a single time encoder circuit limit cycle oscillator and no computation is done beside the conversion from analog to pulse type. Conventional circuits for implementing active filters in the analog domain are based on analog computation, where the information is encoded in the amplitude of voltages or current signals. Accuracy of the conventional circuits is limited by the analog components, such as operational amplifiers. The first embodiment introduces the second order time encoder but does not include filters. The work of Lazar and Toth, that includes time encoder machines, is limited to pulse encoding and does not attempt to do any processing. No prior circuit has proposed to implement filters in the pulse domain.

The second embodiment of the present invention provides the filter circuit including the second order circuits of the first embodiment and a multiple-input time encoder circuit, to perform filtering. The second embodiment presents the first circuit to implement analog filters in the pulse domain. The filter circuit of the second embodiment of the invention allows performing fast and accurate filtering in the pulse domain. It can be applied for real-time pre-processing of input analog signals, such as signals from RF or hyperspectral sensors.

Conventional active filters could be implemented in the (1) original analog domain via for example analog amplifiers and capacitors such as gm-C filters or in the (2) digital domain after an ADC (Analog to Digital Converter) digitization. In the analog domain the disadvantage of the conventional approach is that accuracy is severely limited by dynamic range of the analog components such as feedback analog amplifiers. In the digital domain, the disadvantage is that speed is limited by the performance of ADC conversion.

The filter circuit of the second invention reduces or avoids the accuracy limitation of the analog computing and the speed limitation of the ADC conversion. Assuming ideal elements, the filter circuit of the second embodiment of the present invention may provide an exact solution. In addition, the implementation of the filter circuit of the second embodiment may be more compact than an equivalent analog circuit or a digital circuit. The circuit components include hysteresis quantizers, integrators, and intrinsically linear 1-bit DACs.

The first embodiment of the invention allows fast and accurate solution of differential equations in the pulse domain. It can be applied for real-time processing of input analog signals, such as signals from RF or hyperspectral sensors. The encoder circuits of the first embodiment can solve at high speed problems that can be mapped into a system of coupled linear first order differential equations.

The encoder and filter circuits of the first and second embodiments may be used in RF sensors, hyperspectral sensors, for compact automobile sensors, and in the front end of software radios.

Although the present invention has been described with reference to certain exemplary embodiments, it is understood that a variety of modifications and variations may be made to the present invention without departing from the spirit or scope of the invention defined in the appended claims, and their equivalents.

What is claimed is:

1. A circuit for solving a first order linear ordinary differential equation comprising:
   a second order unit element encoder circuit; and
   a time decoder circuit coupled in series to the second order unit element encoder circuit,
   wherein the second order unit element encoder circuit includes:
   an input amplifier responsive to an input signal and providing an amplified output signal;
   a first 1-bit digital to analog converter having a first 1-bit digital to analog converter input and a first 1-bit digital to analog converter output;
   a first adder having a first adder first input responsive to the amplified output signal and a first adder second input responsive to an output signal from the first 1-bit digital to analog converter to provide a first sum output signal;
   a first integrator responsive to the first sum output signal and providing a first integrated output signal;
   a second 1-bit digital to analog converter having a second 1-bit digital to analog converter input and a second 1-bit digital to analog converter output;
   a second adder having a second adder first input responsive to the first integrated signal and a second adder second input responsive to an output signal from the second 1-bit digital to analog converter signal to provide a second sum signal;
   a second integrator responsive to the second sum signal and providing a second integrated output signal; and
   a hysteresis quantizer responsive to the second integrated output signal and providing a time encoded pulse output signal corresponding to a time encoding of a solution of the first order linear ordinary differential equation,
   wherein the first 1-bit digital to analog converter is responsive to the time encoded pulse output signal and feeds back the time encoded pulse output signal to the first adder second input,
   wherein the second 1-bit digital to analog converter is responsive to the time encoded pulse output signal and feeds back the time encoded pulse output signal to the second adder input, and
   wherein the time decoder circuit is responsive to the time encoded pulse output signal and is adapted to recover the solution of the first order linear ordinary differential equation from the time encoded pulse output signal.

2. The circuit of claim 1, wherein the input signal is an analog signal or a pulse signal.

3. The circuit of claim 1,
   wherein a gain of the input amplifier is a coefficient of the input signal in the first order linear ordinary differential equation, and
   wherein a gain of the second 1-bit digital to analog converter is a coefficient of the solution of the first order linear ordinary differential equation.

4. An array of encoder circuits comprising:
   a first encoder circuit responsive to a first input signal and providing a first output signal;
   a second encoder circuit responsive to a second input signal and providing a second output signal;
   a first cross-feedback 1-bit DAC for providing the second output signal to the first encoder circuit; and
   a second cross-feedback 1-bit DAC for providing the first output signal to the second encoder circuit,
   wherein each encoder circuit in the array of encoder circuits includes:
   an input amplifier responsive to an amplifier input signal;
   a first adder coupled to the input amplifier and to a cross-feedback 1-bit digital to analog converter of the other encoder circuit;
   a first integrator coupled to the first adder;
   a second adder coupled to the first integrator;
   a second integrator coupled to the second adder;
   a hysteresis quantizer coupled to the second integrator and providing a hysteresis quantizer output signal;

a first 1-bit DAC coupled between an output of the hysteresis quantizer and the second adder and providing the hysteresis quantizer output signal as a feedback signal to the second adder; and a second 1-bit DAC coupled between the output of the hysteresis quantizer and the first adder and providing the hysteresis quantizer output signal as a feedback signal to the first adder, wherein the first output signal and the second output signal are time encoded pulse signals.

5. The array of encoder circuits of claim 4, wherein the first output signal is a time encoding of a solution of a first differential equation included in a coupled system of two first order linear ordinary differential equations, and wherein the second output signal is a time encoding of a solution of a second differential equation in the coupled system of two first order linear ordinary differential equations.

6. The array of encoder circuits of claim 5, further comprising a time decoder circuit coupled in series to the each of the first encoder circuit and the second encoder circuit, the time decoder circuit responsive to the first output signal and the second output signal and adapted for recovering a solution to the coupled system of two first order linear ordinary differential equations.

7. The array of encoder circuits of claim 6, wherein the coupled system of two first order linear ordinary differential equations is represented by a 2×2 multiplier matrix multiplied by a 2×1 solution matrix and added to a 2×1 input signal matrix, wherein the second 1-bit digital to analog converter of each encoder circuit has a gain equal to a diagonal element of the multiplier matrix, and wherein the first cross-feedback 1-bit digital to analog converter and the second cross-feedback 1-bit digital to analog converter each have a gain equal to a non-diagonal element of the multiplier matrix.

8. The array of encoder circuits of claim 4, wherein the first input signal and the second input signal are analog signals, and wherein intermediate signals within the first encoder circuit and the second encoder circuit are analog signals.

9. The array of encoder circuits of claim 4, further comprising:

a third cross-feedback 1-bit digital to analog converter for providing the second output signal to a second adder of the first encoder circuit; and a fourth cross-feedback 1-bit digital to analog converter for providing the first output signal to a second adder of the first encoder circuit, wherein the first input signal and the second input signal are time-encoded pulse signals, wherein the first output signal is half of a sum of the first input signal and the second input signal, and wherein the second output signal is half of a difference between the first input signal and the second input signal.

10. The array of encoder circuits of claim 9, wherein the first cross-feedback 1-bit digital to analog converter has a gain of −1, wherein the second cross-feedback 1-bit digital to analog converter has a gain of +1, wherein the third cross-feedback 1-bit digital to analog converter has a gain of −1, wherein the fourth cross-feedback 1-bit digital to analog converter has a gain of +1, and wherein the first 1-bit digital to analog converter of each encoder circuit and the second 1-bit digital to analog converter of each encoder circuit have a gain of −1.

11. A filter circuit for implementing an analog filter of order N, the filter circuit comprising:

a first order unit for producing an output signal, the output signal being a time encoded pulse;

a plurality of N second order units for providing N state variables to the first order unit, the N state variables being time encoded pulses; and wherein each of the N second order units receives cross-feedbacks of the N state variables from each of the N second order units, wherein at least a first one of the N second order units receives an external input signal as input, and wherein the external input signal in selected from a group consisting of an analog signal and a time encoded pulse signal.

12. The filter circuit of claim 11, wherein the output signal is a time encoded voltage pulse and the state variables are time encoded voltage pulses or time encoded current pulses.

13. The filter circuit of claim 11, wherein the first order unit and the second order units each include only 1-bit digital to analog converters for providing internal time encoded pulse feedback.

14. The filter circuit of claim 11, wherein the first order unit includes:

a bank of N 1-bit digital to analog converters, each 1-bit digital to analog converter responsive to one state variable from one of the second order units;

an adder coupled to the bank responsive to an output of each of the N 1-bit digital to analog converters in the bank, the adder adapted to add together the outputs of the N 1-bit digital to analog converters;

an integrator coupled to the adder;

a hysteresis quantizer coupled to the integrator, the hysteresis quantizer producing the output signal; and a feedback amplifier coupled between an output of the hysteresis quantizer and the adder for providing the output signal to the adder.

15. The filter circuit of claim 11, wherein each of the second order units includes:

a bank of N 1-bit digital to analog converters each of the N 1-bit digital to analog converters responsive to a cross-feedback of one state variable from each of the N second order units;

a first adder coupled to the bank responsive to outputs of each of the N 1-bit digital to analog converters in the bank, the first adder adapted to adding together the outputs of the N 1-bit digital to analog converters;

a first integrator coupled to the first adder;

a second adder coupled to the first integrator;

a hysteresis quantizer coupled to the second integrator, the hysteresis quantizer producing an output state variable corresponding to the second order unit; and a feedback amplifier coupled between an output of the hysteresis quantizer and the second adder for providing the output state variable to the second adder.

16. The filter circuit of claim 15, wherein the first one of the second order units further includes an input amplifier coupled to the first adder, the input amplifier responsive to the input signal.

17. The filter circuit of claim 16, wherein the input amplifier is a 1-bit digital to analog converter.

18. The filter circuit of claim 11, wherein the filter circuit implements a filter transfer function selected from a group consisting of Butterworth transfer function, Chebychev transfer function, family of Elliptic transfer functions in a configuration selected from a group consisting of low pass, high pass, band pass, and band stop.

19. The filter circuit of claim 11, wherein the first order unit is a multiple-input unit element of the first order and the second order unit is a multiple-input unit element of the second order.

20. The filter circuit of claim 11, wherein the first order unit and the second order unit are implemented in Indium Phosphate fast current IC technology.

* * * * *